(12) United States Patent
Kim et al.

(10) Patent No.: US 6,432,843 B1
(45) Date of Patent: Aug. 13, 2002

(54) METHODS OF MANUFACTURING INTEGRATED CIRCUIT DEVICES IN WHICH A SPIN ON GLASS INSULATION LAYER IS DISSOLVED SO AS TO RECESS THE SPIN ON GLASS INSULATION LAYER FROM THE UPPER SURFACE OF A PATTERN

(75) Inventors: Jae-Hak Kim; Hong-Jae Shin, both of Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/997,161

(22) Filed: Nov. 29, 2001

(30) Foreign Application Priority Data

Nov. 30, 2000 (KR) .............................................. 00-72089

(51) Int. Cl.[7] ...................... H01L 21/31; H01L 21/469; H01L 21/4763
(52) U.S. Cl. ...................... 438/782; 438/623; 438/626; 438/780
(58) Field of Search ................................ 438/782, 623, 438/626, 780

(56) References Cited

U.S. PATENT DOCUMENTS

| | | | | |
|---|---|---|---|---|
| 6,117,798 A | * | 9/2000 | Fang et al. | 438/782 |
| 6,146,990 A | * | 11/2000 | Sung et al. | 438/622 |
| 6,150,274 A | * | 11/2000 | Liou et al. | 438/692 |
| 6,214,749 B1 | * | 4/2001 | Watanabe et al. | 438/783 |
| 6,274,515 B1 | * | 8/2001 | Hughes et al. | 438/780 |
| 6,346,473 B1 | * | 2/2002 | Chang et al. | 438/631 |

* cited by examiner

Primary Examiner—Alexander Ghyka
(74) Attorney, Agent, or Firm—Myers Bigel Sibley & Sajovec

(57) ABSTRACT

An integrated circuit device is manufactured by forming a pattern on a substrate. The pattern may include two or more mesa regions. The pattern and the substrate are coated with a spin on glass layer and then the spin on glass layer is dissolved so that the spin on glass layer is recessed from upper surfaces of the mesa regions opposite the substrate. Before dissolving the spin on glass layer, a thermal treatment may be applied to remove a solvent from the spin on glass layer.

20 Claims, 8 Drawing Sheets

METHODS OF MANUFACTURING INTEGRATED CIRCUIT DEVICES IN WHICH A SPIN ON GLASS INSULATION LAYER IS DISSOLVED SO AS TO RECESS THE SPIN ON GLASS INSULATION LAYER FROM THE UPPER SURFACE OF A PATTERN

RELATED APPLICATION

This application claims the benefit of Korean Patent Application No. 2000-72089, filed Nov. 30, 2000, the disclosure of which is hereby incorporated herein by reference.

FIELD OF THE INVENTION

The present invention relates generally to integrated circuit devices and manufacturing methods therefor and, more particularly, to insulation layers that may be used to fill space between integrated circuit patterns and manufacturing methods therefor.

BACKGROUND OF THE INVENTION

In general, integrated circuit devices have become more highly integrated and may have multilevel architectures and/or minute elements therein. In highly integrated devices, an aspect ratio of a contact hole or a via hole that connects an upper and a lower element may be relatively high. Moreover, step coverage of an insulation layer may vary between high-density patterns and low-density patterns and/ or between upper patterns and lower patterns. An insulation layer that provides good step coverage for a lower pattern, however, may cause problems in patterning an upper interconnection or element. Thus, it may be desirable to reduce the step coverage of an insulation layer depending on the region of an integrated circuit device. For example, it is common in dynamic random access memory (DRAM) manufacturing to fill narrow grooves between gate lines and/or bit lines formed at a substrate with an interlayer insulation layer, and then to planarize a top side of the interlayer insulation layer.

One approach to reducing the step coverage of an insulation layer, is to form a layer of boro-phospho-silicate-glass (BPSG) and then reflow the BPSG layer at a temperature over 830° C. Unfortunately, in highly integrated circuit devices, transistors may have a critical dimension of 0.2 microns or less. The thermal treatments of the BPSG layer, may adversely affect such transistors.

Other materials and methods may be used to form insulation layers, such as tetra-ethyl-ortho-silicate (ozone-TEOS), undoped silicate glass (USG), and high-density plasma chemical vapor deposition (HDP-CVD). Such materials and methods, however, may exhibit a void or a seam when used in integrated circuit devices that follow a design rule of 0.2 microns or less.

For example, an HDP-CVD oxide film may be used to fill a gap between bit lines in which the width of the gap is approximately 5000 Å and the height of the gap is approximately 10,000 Å. Unfortunately, a void may be formed in the HDP-CVD oxide film, which may cause cracks in subsequent processes. Thus, the reliability of an integrated circuit device may be degraded.

Another material that may be used in insulation layers is spin on glass (SOG). In general, SOG has relatively good gap filling properties, and may compensate for step coverage when thickly formed. After an integrated circuit device is coated with an SOG layer, densification and curing steps may be performed to eliminate unstable components from the SOG layer. For example, an SOG layer may be heated to a temperature between approximately 100° C. and 300° C. to remove a solvent component. The SOG layer may be further heated to a temperature of about 400° C. and/or may be annealed at a temperature of over 600° C. Unfortunately, SOG layers may be susceptible to cracks in thickly formed regions. Furthermore, chemical mechanical polishing is frequently performed to reduce the step coverage in SOG layers.

Even if an SOG layer is thermally treated, residual components may remain in the SOG layer that may degrade the characteristics of the SOG layer. For example, residual components such as organics, hydrics, and or other inorganic materials may cause problems relating to pollution of the device, the absorption of water, and the porousness of an SOG layer. In particular, residual components may remain in lower portions of gaps having high aspect ratios as the thermal treatment is generally more effective near the surface of an SOG layer.

If an SOG layer is left in a porous state due to the presence of residual components, then the porous regions of the SOG layer may etch more rapidly than other portions of the SOG layer. Moreover, stress differences due to thermal expansion may increase defect generation and may also reduce element reliability in an integrated circuit device.

For example, if a field effect transistor, such as a metal oxide semiconductor (MOS) transistor, is formed on a substrate with an inorganic SOG layer, such as hydro silsesquioxane (HSQ) or polysilazane, a porous layer may be formed in deep portions between the gate lines. The porous lower portion of the SOG layer may be exposed when forming a pad for a storage node contact or a bit line contact. Unfortunately, even small doses of etchant used in a cleaning step may erode the exposed lower SOG layer. As a result, a pipeline type bridge may be formed between adjacent pads through the exposed lower SOG layers, which may cause a short between electrical wires.

SUMMARY OF THE INVENTION

According to embodiments of the present invention, an integrated circuit device is manufactured by forming a pattern on a substrate. The pattern may comprise two or more mesa regions. The pattern and the substrate are coated with a spin on glass layer and then the spin on glass layer is dissolved so that the spin on glass layer is recessed from upper surfaces of the mesa regions opposite the substrate.

In other embodiments, an insulation layer is deposited on the spin on glass layer between the mesa regions to form a composite insulation layer. The second insulation layer may comprise $SiO_2$, SiN, and/or SiON. The spin on glass layer may comprise polysilazane, hydro silsesquioxane, silicate, and/or methyl silsesquioxane. Advantageously, the composite insulation layer may resist the formation of voids when applied in gaps having a high aspect ratio.

In still other embodiments, the spin on glass layer may comprise hydro silsesquioxane, and tetramethyl ammonium hydroxide may be used to dissolve the spin on glass layer. In other embodiments, the spin on glass layer may comprise methyl silsesquioxane, and a fluoride base semi aquose solution mixed with one or more of dimethyl acetate, fluoride ammonium, and the like may be used to dissolve the spin on glass layer. Alternatively, a fluoride base semi aquose solution mixed with one or more of dyglicol amin, hydroxyl amin, cathecole mono ethanol amin, and the like may be used to dissolve the spin on glass layer.

In further embodiments, a mask, such as photoresist, is formed on the spin on glass layer on a region adjacent the pattern before dissolving the spin on glass layer. The mask may then be removed after dissolving the spin on glass layer.

In still further embodiments, an integrated circuit device is manufactured by forming a pattern on a substrate. The pattern may comprise two or more mesa regions. The pattern and the substrate are coated with a spin on glass layer and then a solvent is removed from the spin on glass layer. The solvent may be removed by heating the spin on glass layer at a temperature in a range of about 50° C. to about 400° C.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
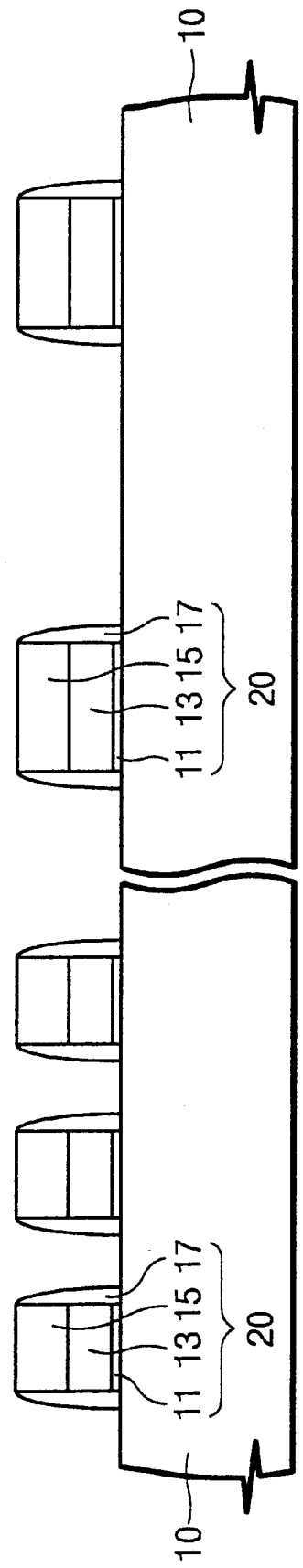
FIGS. 1–8 are cross sectional views that illustrate integrated circuit devices having composite insulation layers and methods of manufacturing same in accordance with embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

FIGS. 1–8 are cross sectional views that illustrate integrated circuit devices having composite insulation layers and methods of manufacturing same in accordance with embodiments of the present invention.

Referring now to FIG. 1, in accordance with embodiments of the present invention, an integrated circuit device comprises a pattern 20 that is formed on a substrate 10. The pattern 20 may comprise, for example, an insulated gate electrode of a field effect transistor. It will be understood, however, that other patterns may also be formed. Each mesa in the pattern 20 comprises a gate insulation film 11, a gate film 13, and a capping film 15. The capping film 15 and the gate film 13 may each have a thickness of approximately 2000 Å. The capping film 15 may comprise SiC, SiN, and/or $SiO_2$. Sidewall spacers 17, which may comprise SiN and have a thickness of approximately 1000 Å, are formed through deposition and successive isotropic etching. Before forming the spacers 17, however, ion implantation may be performed to form the source and drain regions in the substrate 10.

Figure 2:
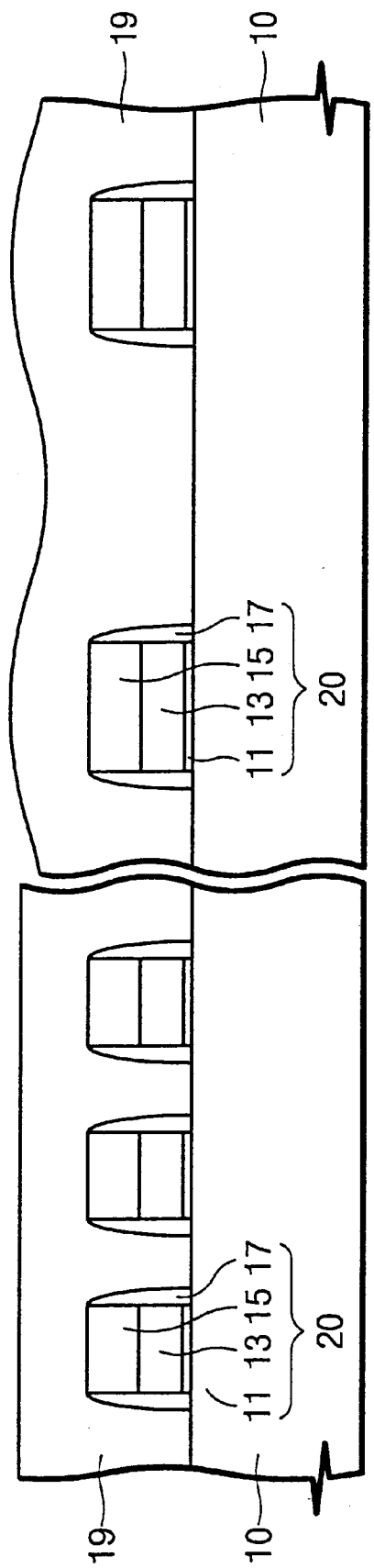

Referring now to FIG. 2, an SOG layer 19 is spin coated over the substrate 10 and the pattern 20. The SOG layer 19 may comprise an inorganic material, such as HSQ. In other embodiments of the present invention, the SOG layer 19 may comprise an organic material such as methyl silsesquioxane (MSQ), polysilazane, and/or silicate. In a first area, such as the cell area of a DRAM, where the density of the mesas comprising the pattern 20 is greater, the SOG layer 19 may be formed to a thickness of approximately 2000 Å. In other areas, such as areas of a DRAM surrounding the cell area, i.e., the peripheral area, where the density of the mesas comprising the pattern is not as great, the SOG layer may be formed to a thickness of approximately 1000 Å. After coating the substrate 10 and the pattern 20 with the SOG layer 19, the resulting structure may be thermally treated to remove a solvent component from the SOG layer 19. In particular, the resulting structure may be heated to a temperature in a range of about 50° C. to about 400° C. A soft bake may be performed at a temperature in a range of about 50° C. to about 350° C., while a hard bake may be performed at about 400° C. During performance of the hard bake, almost all of the hydrate ions in a HSQ SOG layer 19 remain in a residual state.

In other embodiments of the present invention, an adhesive layer, such as an HDP-CVD oxide layer, may be applied to the substrate 10 and the pattern 20 before forming the SOG layer 19. The adhesive layer may have a thickness between several tens and several hundreds of angstroms.

Figure 3:
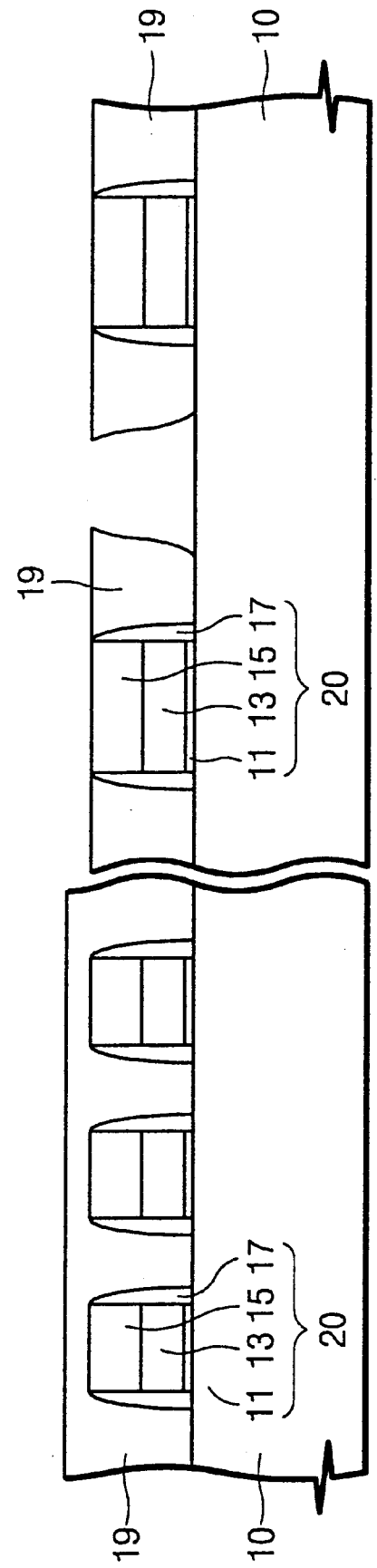

Referring now to FIG. 3, a solvent is used to dissolve the SOG layer 19. When the SOG layer 19 comprises HSQ, tetramethyl ammonium hydroxide, which is a photoresist developing solution, may be used as the solvent. As shown in FIG. 3, by immersing the integrated circuit device structure in tetramethyl ammonium hydroxide for approximately two minutes, the SOG layer 19 is substantially removed between mesas comprising the pattern 20 in generally low aspect ratio areas surrounding the cell area so that the substrate 10 is exposed. By contrast, the SOG layer 19 covers the mesas comprising the pattern 20 in the generally high aspect ratio cell area.

Figure 4:
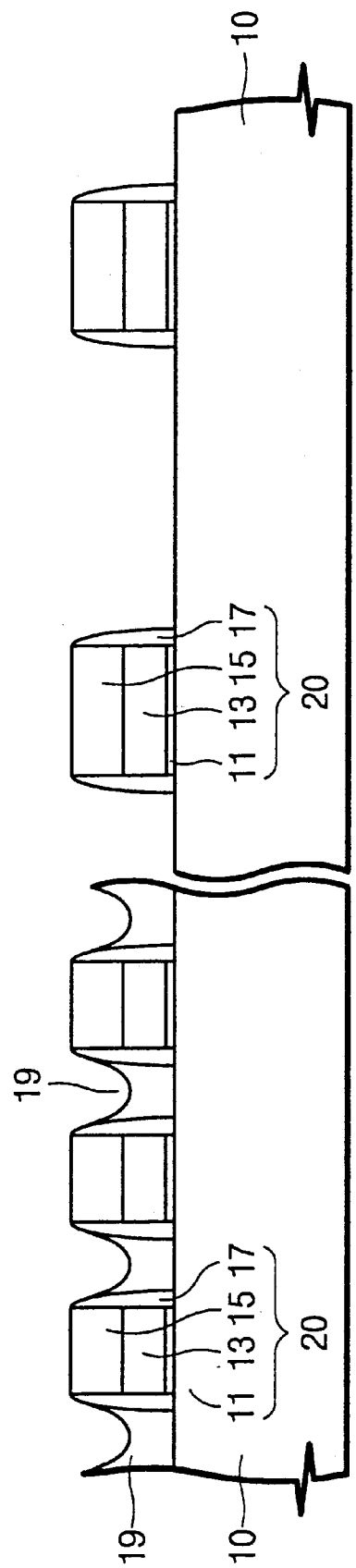

Referring now to FIG. 4, the integrated circuit device is shown after being immersed in tetramethyl ammonium hydroxide for approximately five minutes. In the generally low aspect ratio areas surrounding the cell area, the SOG layer 19 is substantially removed to expose the mesas comprising the pattern 20 and the substrate 10. In the generally high aspect ratio cell area, however, the SOG layer 19 is recessed below the upper surfaces of the mesas comprising the pattern 20, opposite the substrate 10. In accordance with embodiments of the present invention, the SOG layer 19 may fill approximately 5% to near 100% of a gap between a pair of mesa regions comprising the pattern 20 in the cell area.

The integrated circuit device may be cleaned and an annealing process may be performed to densify and cure the SOG layer 19. The temperature and time used in the annealing process may vary based on the thickness of the SOG layer 19 that remains between the mesas comprising the pattern 20 in the cell area. The annealing process may improve the wet etching resistance of the SOG layer 19.

Figure 5:
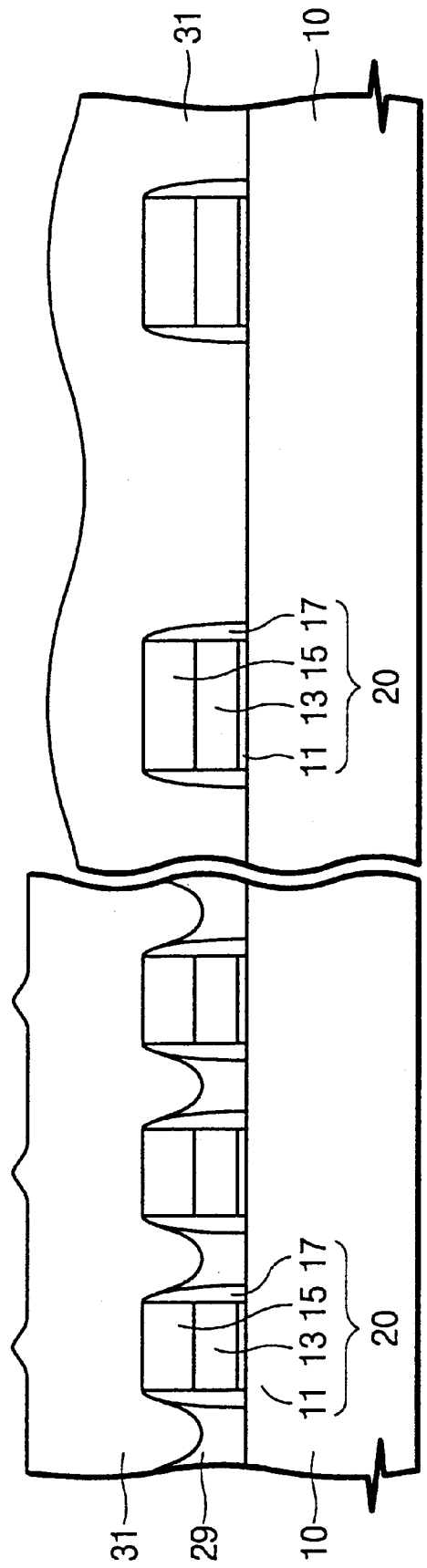

Referring now to FIG. 5, the high temperature annealing process turns at least some of the SOG layer 19 into a $SiO_2$ film 29. An HDP-CVD insulation layer 31 is formed on the $SiO_2$ film 29 (or the SOG layer 19) within the gaps between the mesas comprising the pattern 20 and extends onto the pattern 20 in the cell area. The HDP-CVD insulation layer 31 is formed on the substrate 10 within the gaps between the mesas comprising the pattern 20 and covers the pattern 20 in areas surrounding the cell area. In accordance with embodiments of the present invention, the HDP-CVD layer 31 may comprise an oxide layer (e.g., HDP-CVD $SiO_2$), a SiN layer, and/or a SiON layer. Thus, a composite insulation layer comprising the SOG layer 19 and/or the $SiO_2$ film 29 and the HDP-CVD layer 31 may be formed without generating a void or a seam therein. The resultant structure may be further processed by forming a plasma enhanced chemical vapor deposition (PECVD) oxide layer thereon, or by planarizing the surface using, for example, a CMP process.

Figure 6:
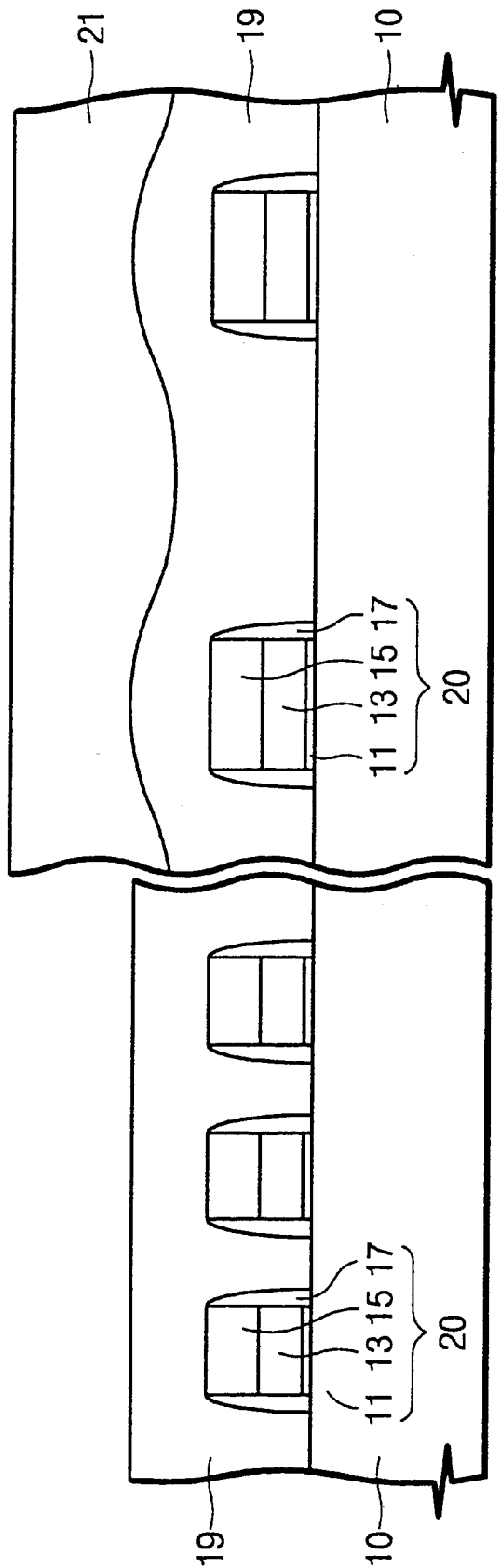
Figure 7:
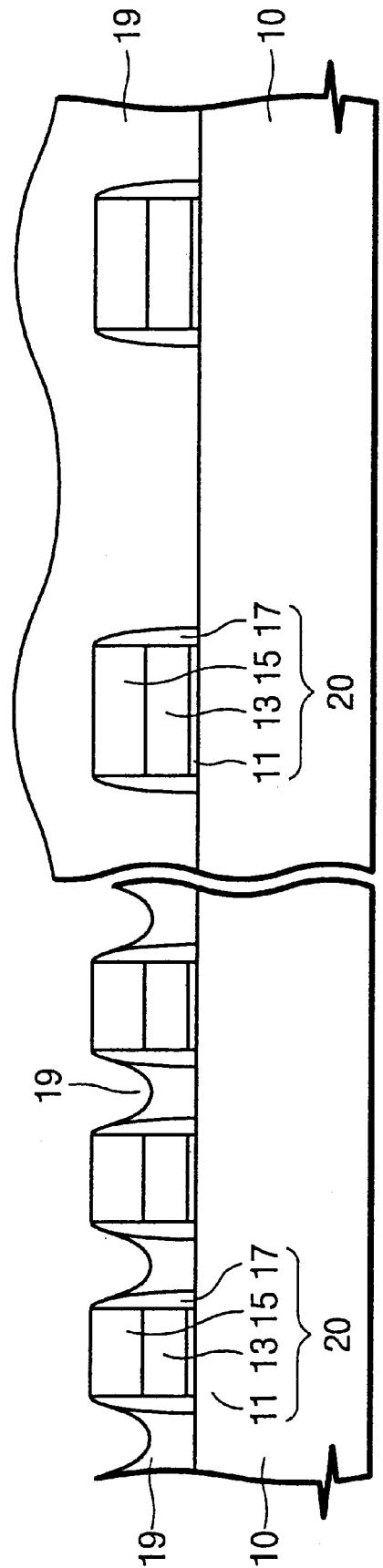

Referring now to FIG. 6, in other embodiments of the present invention, a mask 21, such as photoresist, is formed on the resultant structure of FIG. 2 such that the mask 21 is disposed on the areas surrounding the cell area. As shown in FIG. 7, a solvent, such as tetramethyl ammonium hydroxide, is used to dissolve the SOG layer 19 as discussed above with reference to FIGS. 3 and 4. After being immersed in tetramethyl ammonium hydroxide for about five minutes, substantially all of the HSQ SOG layer 19 remains in the areas surrounding the cell area because of the protection provided by the photoresist, while approximately half of the HSQ SOG layer 19 remains in the gaps between the mesas comprising the pattern 20 in the cell area. An annealing process at a temperature of approximately 600° C. may be performed to densify and cure the SOG layer 19, which turns at least some of the SOG layer 19 into a $SiO_2$ film as discussed above. Although the SOG layer 19 is relatively thick in areas surrounding the cell area, the $SiO_2$ film may be readily formed due to the easy diffusion of oxygen in the wide gaps between the mesas comprising the pattern 20 in the areas surrounding the cell area. The SOG layer 19 is relatively thin in the cell area, which facilitates the diffusion of oxygen and the formation of the $SiO_2$ film.

Figure 8:
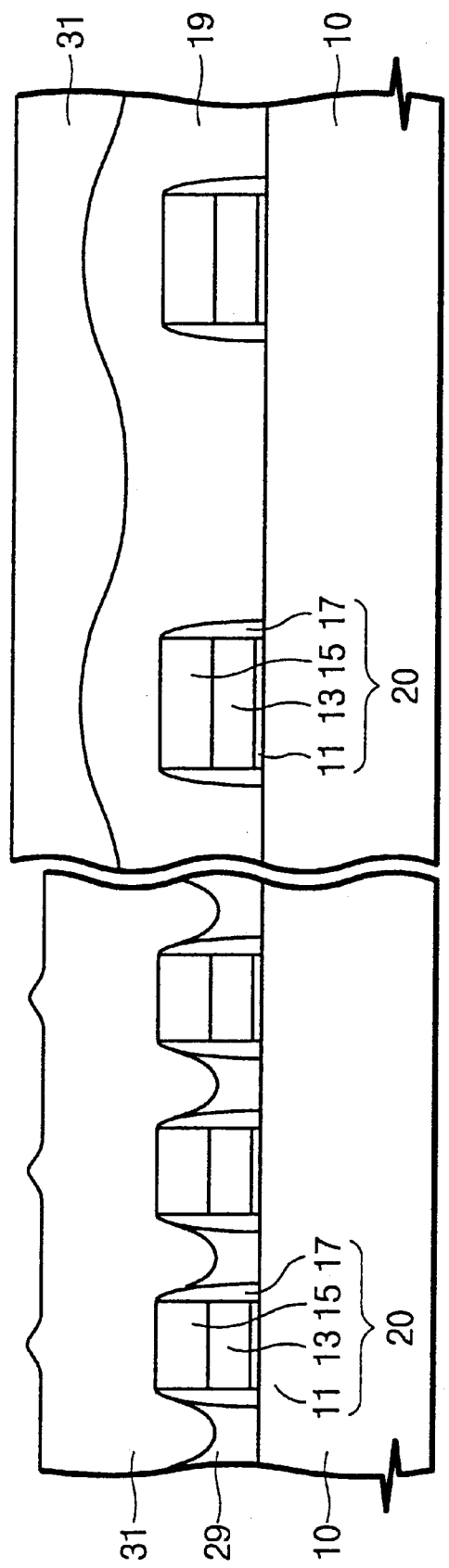

Referring now to FIG. 8, an HDP-CVD insulation layer 31 is formed on the SOG layer 19 in areas surrounding the cell area. The HDP-CVD insulation layer 31 is formed on the $SiO_2$ film 29 (or the SOG layer 19) within the gaps between the mesas comprising the pattern 20 and extends onto the pattern 20 in the cell area. Because the SOG layer 19 is left substantially intact in areas surrounding the cell area, fewer extraneous particles are generated that may need to be removed.

In other embodiments of the present invention, the SOG layer 19 may comprise MSQ, and a fluoride base semi aquose solution mixed with one or more of dimethyl acetate, fluoride ammonium, and the like may be used to dissolve the SOG layer 19. Alternatively, a fluoride base semi aquose solution mixed with one or more of dyglicol amin, hydroxyl amin, cathecole mono ethanol amin, and the like may be used to dissolve the SOG layer 19. Because the SOG layer 19 may comprise various organic and inorganic materials, in accordance with embodiments of the present invention, the solvent used to dissolve the SOG layer 19 may be chosen based on the particular characteristics of the SOG layer 19. By thermally treating the SOG layer 19, the solubility of the SOG layer 19 may be enhanced to facilitate dissolution.

Thus, in accordance with embodiments of the present invention, a composite insulation layer comprising a SOG layer and an HDP-CVD layer may be formed that may resist the formation of voids when applied in gaps having a high aspect ratio. Moreover, the composite insulation layer may inhibit the formation of pipeline type bridges between adjacent pads when the composite insulation layer is used as an intermediate insulation film.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of manufacturing an integrated circuit device, comprising:

forming a pattern comprising a pair of mesa regions on a substrate;

coating the pattern and the substrate with a spin on glass layer; and dissolving the spin on glass layer so that the spin on glass layer is recessed from upper surfaces of the mesa regions opposite the substrate.

2. The method of claim 1, further comprising:

forming an insulation layer on the spin on glass layer between the pair of mesa regions.

3. The method of claim 1, further comprising:

thermally treating the spin on glass layer before dissolving the spin on glass layer.

4. The method of claim 3, wherein thermally treating the spin on glass layer comprises:

heating the spin on glass layer at a temperature in a range of about 50° C. to about 400° C.

5. The method of claim 1, wherein the spin on glass layer is selected from the group consisting of hydro silsesquioxane, methyl silsesquioxane, polysilazane, and silicate.

6. The method of claim 1, wherein the spin on glass layer comprises hydro silsesquioxane, and wherein dissolving the spin on glass layer comprises:

dissolving the spin on glass layer using tetramethyl ammonium hydroxide so that the spin on glass layer is recessed from the upper surfaces of the mesa regions opposite the substrate.

7. The method of claim 1, wherein the spin on glass layer comprises methyl silsesquioxane, and wherein dissolving the spin on glass layer comprises:

dissolving the spin on glass layer using a fluoride base semi aquose solution mixed with at least one of dimethyl acetate, fluoride ammonium, dyglicol amin, hydroxyl amin, and cathecole mono ethanol amin so that the spin on glass layer is recessed from the upper surfaces of the mesa regions opposite the substrate.

8. The method of claim 1, wherein coating the pattern is preceded by:

depositing an adhesive layer on the substrate.

9. The method of claim 1, wherein dissolving the spin on glass layer is followed by:

converting at least some of the spin on glass layer to $SiO_2$.

10. A method of forming an insulation film for a semiconductor device, comprising:

depositing a SOG (spin on glass) insulation material on a substrate where a plurality of patterns is formed with step coverage space therebetween;

forming a material film that is free of solvents on the plurality of patterns and in the step coverage space by baking the insulation material;

recessing the material film which fills at least part of the step coverage space between the patterns by dissolving the material film in a liquid; and depositing a CVD (chemical vapor deposition) insulation film on the recessed material film.

11. The method of claim 10, wherein the material is HSQ (hydro silsesquioxane) and the liquid is tetra methyl ammonium hydro oxide.

12. The method of claim 10, wherein the material is methyl silsesquioxane(MSQ) and the liquid is a fluoride base semi aquose solution mixed with at least one of dimethyl acetate, fluoride ammonium, dyglicol amin, hydroxyl amin, and cathecole mono ethanol amin.

13. The method of claim 10, wherein baking the insulation material is performed at a temperature in a range of about 50° C. to about 400° C.

14. The method of claim 10, wherein recessing the material film is performed until an amount of the material film remaining in the step coverage space is about 5% to about 100% of a depth of the step coverage space.

15. The method of claim 10, wherein the following is performed between recessing the material film and depositing the CVD insulation film:

converting at least some of the recessed material film into a silicon oxide film.

16. The method of claim 10, wherein the CVD insulation film comprises at least one of an oxide film, a nitride film and an oxide-nitride film formed by a HDP CVD (High Density Plasma Chemical Vapor Deposition) process.

17. The method of claim 10, wherein the following is performed prior to depositing the SOG insulation material:

forming an adhesive insulation film on the substrate.

18. The method of claim 17, wherein the adhesive insulation film is formed by a HDP CVD (High Density Plasma Chemical Vapor Deposition) process.

19. A method of forming an insulation film on a semiconductor memory device, the method comprising:

depositing a SOG insulation material on a memory device substrate having a cell area with high-density patterns and a peripheral area with low-density patterns;

forming a material film that is free of solvents by baking the insulation material;

exposing the cell area and forming an etching mask pattern which covers the peripheral area;

recessing the material film which fills at least part of a step coverage space between the patterns by dissolving the material film in a liquid;

removing the etching mask pattern; and depositing a CVD (chemical vapor deposition) insulation film on the recessed material film.

20. The method of claim 19, wherein the following is performed prior to depositing the SOG insulation material:

forming an adhesive insulation film on the substrate.

* * * * *